(12) United States Patent
Oberg et al.

(10) Patent No.: US 8,942,280 B1
(45) Date of Patent: Jan. 27, 2015

(54) METHOD AND APPARATUS FOR TIMING JITTER MEASUREMENT

(71) Applicant: Marvell International Ltd., Hamilton (BM)

(72) Inventors: Mats Oberg, San Jose, CA (US); Jin Xie, Longmont, CO (US); Bin Ni, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/174,365

(22) Filed: Feb. 6, 2014

Related U.S. Application Data

(63) Continuation of application No. 12/192,877, filed on Aug. 15, 2008, now Pat. No. 8,660,171.

(60) Provisional application No. 60/955,938, filed on Aug. 15, 2007.

(51) Int. Cl.
*H04B 17/00* (2006.01)
*H04L 1/20* (2006.01)

(52) U.S. Cl.
CPC .................................... *H04L 1/205* (2013.01)
USPC ........... 375/226; 375/224; 375/225; 375/340; 375/355; 375/371; 375/373; 375/376; 375/229

(58) Field of Classification Search
USPC ........................... 375/224–226, 340, 355, 372
See application file for complete search history.

(56) References Cited

U.S. PATENT DOCUMENTS

| | | | | |
|---|---|---|---|---|
| 5,793,818 A | * | 8/1998 | Claydon et al. | 375/326 |
| 6,775,321 B1 | * | 8/2004 | Soma et al. | 375/226 |
| 6,801,922 B2 | * | 10/2004 | Goszewski et al. | 708/313 |
| 7,945,009 B1 | * | 5/2011 | Liu et al. | 375/371 |
| 2003/0016600 A1 | | 1/2003 | Hiratsuka | |
| 2004/0114912 A1 | * | 6/2004 | Okamoto et al. | 386/114 |
| 2004/0131113 A1 | * | 7/2004 | Rao | 375/226 |
| 2005/0232383 A1 | * | 10/2005 | Sommer | 375/350 |
| 2007/0248191 A1 | | 10/2007 | Pettersson | |
| 2008/0012882 A1 | * | 1/2008 | Koyanagi | 345/660 |
| 2008/0284630 A1 | | 11/2008 | Kikugawa et al. | |

OTHER PUBLICATIONS

"Jitter Measurement Technology in Blu-ray Disc," presented by Leader Electronics Corp., BDA Taiwan Seminar, Oct. 14, 2005.
Ralston et al., "A First Course in Numerical Analysis: Second Edition," Published by Courier Dover Publications, pp. 54-57, 2001.

* cited by examiner

*Primary Examiner* — Daniel Washburn
*Assistant Examiner* — Eboni Hughes

(57) ABSTRACT

A timing jitter measurement circuit for measuring timing jitter in the digital domain may use an interpolator bank to over-sample a signal from a media reader, a zero crossing estimator to estimate a zero crossing moment in the output of the interpolator bank and a time interval analyzer (TIA) to calculate the timing jitter as the deviation of the estimated zero crossing moment from an expected zero crossing moment in a clock signal. The timing jitter measurement circuit may be integrated into digital circuitry since it avoids using analog devices. Consequently, it may simplify the chip design, lower power consumption and save space.

20 Claims, 7 Drawing Sheets

US 8,942,280 B1

METHOD AND APPARATUS FOR TIMING JITTER MEASUREMENT

CROSS REFERENCE TO RELATED APPLICATION

This application is a continuation of U.S. application Ser. No. 12/192,877, filed on Aug. 15, 2008, which claims priority under 35 U.S.C. §119(e) to U.S. Provisional Application No. 60/955,938, filed on Aug. 15, 2007. The disclosures of the applications referenced above are incorporated herein by reference in their entireties.

BACKGROUND

1. Field of the Invention

The present invention relates generally to data storage systems, and more particularly to timing jitter measurement.

2. Description of Related Art

In data storage systems, timing jitter is an important parameter for determining signal quality. Smaller timing jitter indicates better signal quality. Currently available technologies usually measure timing jitter with analog circuits and analyzers. FIG. 1A illustrates a currently available apparatus for measuring timing jitter. An incoming radio frequency (RF) signal may come from a media reader, e.g., a laser reader or a magnetic reader, and may be fed through an analog/digital converter (A/D) 101, an equalizer 102 and a limit equalizer 103. The digital signal at the output of the limit equalizer 103 is converted into an analog signal by a digital/analog converter (D/A) 105. An LPF (Low Pass Filter) 106 may receive the analog signal from the D/A 105, remove its high frequency parts and reconstruct it into a smoother analog signal. As shown in FIG. 1B, a slicer 107 may detect zero crossing (ZC) moments in the analog signal from the LPF 106. A PLL (Phase-Locked Loop) 104 may receive the analog signal from the limit equalizer 103 and provide a clock signal to the A/D 101, the equalizers 102 and 103, the D/A 105 and a TIA (Timing Interval Analyzer) 108. As shown in FIG. 1B, the TIA 108 may compare the detected zero crossing moments from the slicer 107, represented by solid lines, and expected zero crossing moments from the PLL 104, e.g., the falling edges t0, t1 . . . t4 of each clock pulse represented by dash lines, and output the time differences therebetween as the timing jitter.

Since the D/A 105 and the LPF 106 are used to transform the output of the limit equalizer 103 from the digital domain to the analog domain, and the slicer 107 is used to detect the zero crossing moments, the input signal of the TIA 108 does not have more information, useful for timing jitter calculation, than does the output signal of the limit equalizer 103. However, it can be difficult to integrate these analog devices into chips.

Therefore, it may be desirable to provide an all digital jitter measurement circuit.

BRIEF DESCRIPTION OF THE DRAWING FIGURES

Embodiments of the present invention are described herein with reference to the accompanying drawings, similar reference numbers being used to indicate functionally similar elements.

DETAILED DESCRIPTION

Figure 1A:
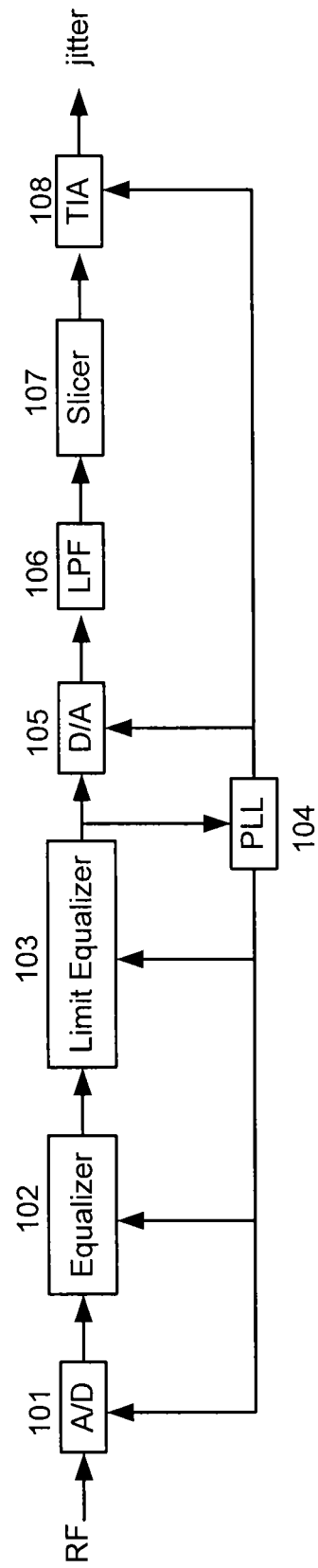
FIGS. 1A and 1B illustrate a currently available analog timing jitter measurement circuit and its operation.
Figure 1B:
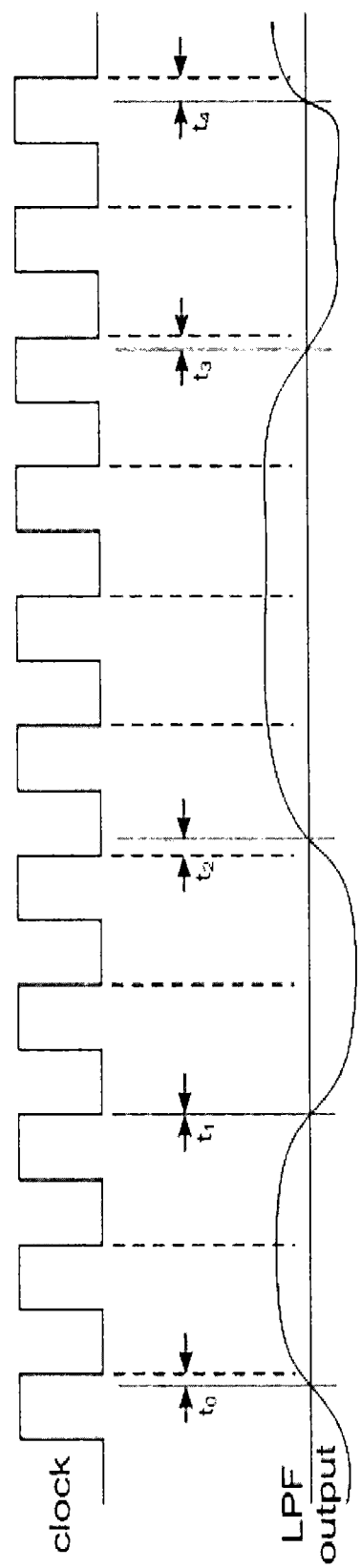

The present invention provides a timing jitter measurement circuit to measure timing jitter in the digital domain. It uses digital devices to replace the analog devices in the circuit shown in FIG. 1A. Specifically, it may use an interpolator bank to over-sample the digital output of the limit equalizer 103, a zero crossing estimator to estimate a zero crossing moment in the output of the interpolator bank, and a time interval analyzer (TIA) to calculate the timing jitter as the deviation of the estimated zero crossing moment provided by the zero crossing estimator from an expected zero crossing moment in the clock signal provided by the PLL 104. Since the analog devices, including the D/A 105, the LPF 106, the slicer 107 and the TIA 108, are no longer needed, the timing jitter measurement circuit of the present invention may be integrated into digital circuitry. Consequently, it is possible to simplify the chip design, lower power consumption and save space.

Figure 2:
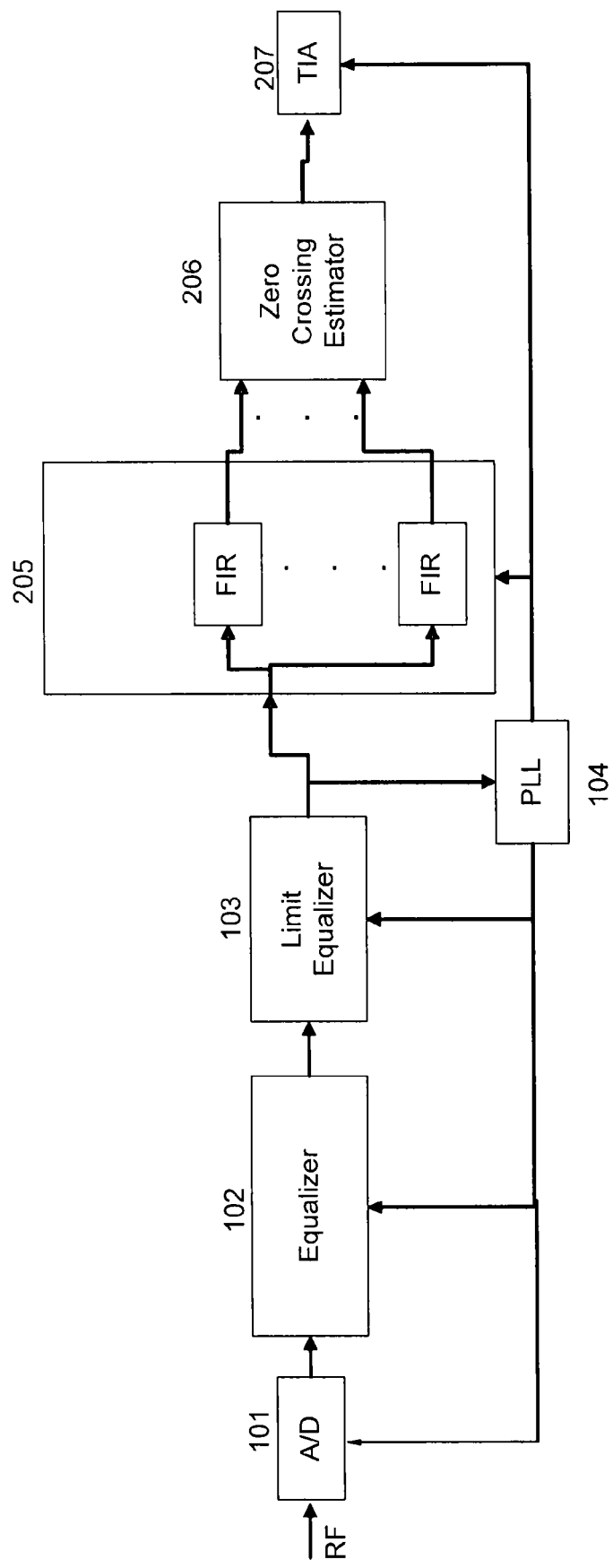
FIG. 2 illustrates a digital timing jitter measurement circuit according to one embodiment of the present invention.
Figure 3:
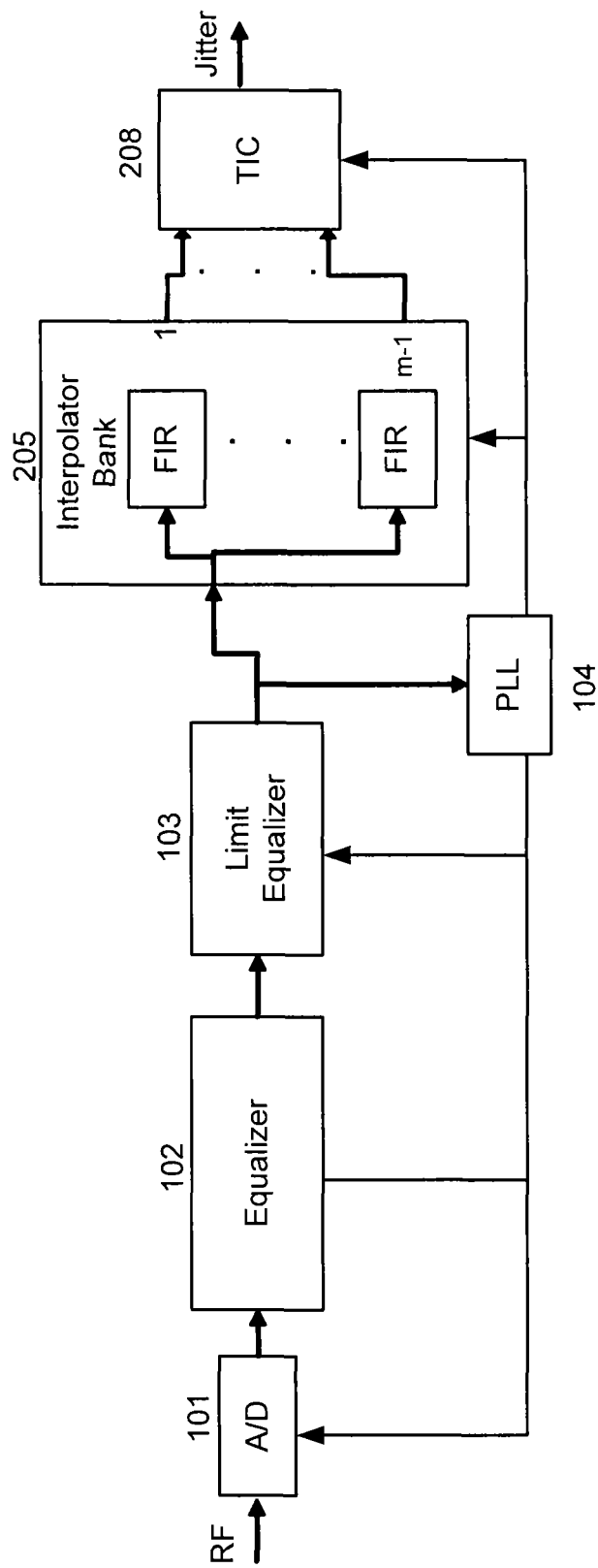
FIG. 3 illustrates a digital timing jitter measurement circuit according to one embodiment of the present invention.
Figure 4:
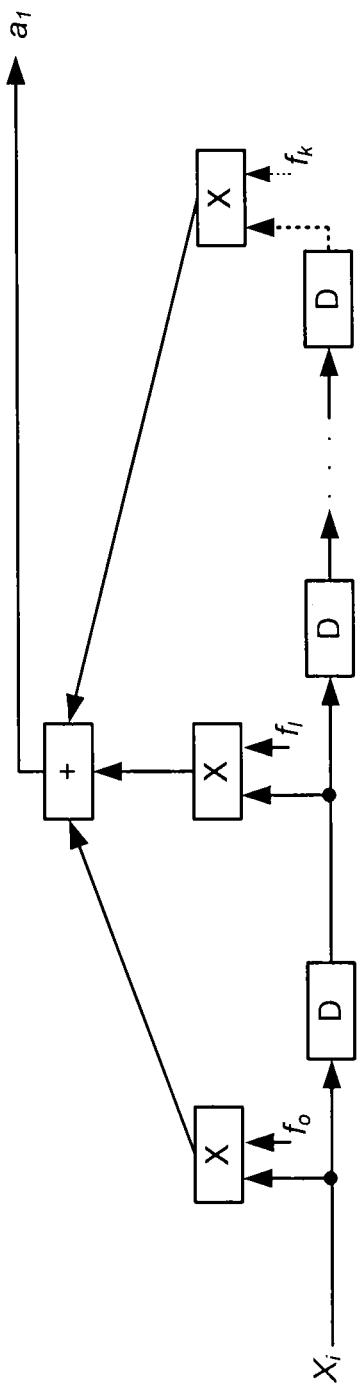
FIG. 4 illustrates an example of a K-tap finite impulse response (FIR) interpolator which may be used in a digital timing jitter measurement circuit according to one embodiment of the present invention.

FIG. 2 illustrates a digital timing jitter measurement circuit according to one embodiment of the present invention. The circuit shown in FIG. 2 may keep the digital devices in the circuit shown in FIG. 1A, including the A/D 101, the equalizer 102, the limit equalizer 103 and the PLL 104. An interpolator bank 205 may comprise a number of interpolators and may generate several different interpolations of the output of the limit equalizer 103, thus providing an over-sampled version of the output of the limit equalizer 103. The interpolator may be an FIR interpolator, the operation of which is shown in FIG. 4. The number of interpolators equals the over-sampling rate m. A zero crossing estimator 206 may receive the outputs of the interpolator bank 205, or the samples, and select the two samples closest to zero, with one sample on each side of zero. With these two samples, the zero crossing estimator 206 may then calculate an estimated zero crossing moment through linear interpolation. A TIA 207 may calculate the timing jitter by comparing the estimated zero crossing moment and an expected zero crossing moment in the clock signal from the PLL 104. The zero crossing estimator 206 and the TIA 207 may be integrated into one device, e.g., a TIC (Time Interval Calculator) 208 shown in FIG. 3.

FIG. 4 illustrates an example of a K-tap FIR interpolator which may be used in a digital timing jitter measurement circuit according to one embodiment of the present invention. The FIR interpolator may be used to perform equations (3) and/or (8) discussed below.

Figure 5:
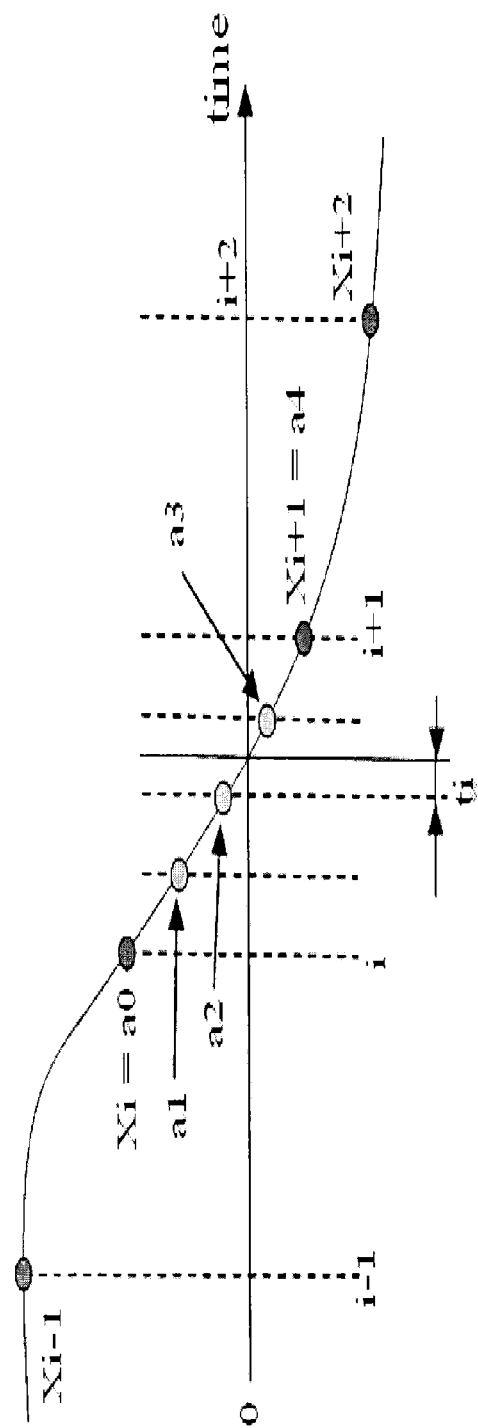
FIG. 5 illustrates an example of signals generated during the operation of a digital timing jitter measurement circuit according to one embodiment of the present invention, with the over-sampling rate of an interpolator m=4.

FIG. 5 illustrates an example of signals generated during the operation of a digital jitter measurement circuit according to one embodiment of the present invention, with the over-sampling rate m=4. As shown, the output signal from the limit equalizer 103 may have four values $X_{i-1}, X_i, X_{i+1}$ and $X_{i+2}$ at moments i−1, i, i+1 and i+2. Samples $a_1$-$a_3$ may be generated by interpolators 1 to 3 in the interpolator bank 205 and may represent the 4× over-sampled signal in a bit interval (normalized to 1 in this example) from the moment i to the moment i+1. As shown, $a_0$ is $X_{i-1}$, $a_4$ is $X_i$, and $a_1$-$a_3$ are the additional samples generated by the interpolators. The zero crossing estimator 206 may receive the samples $a_0$-$a_4$ from the interpolator bank 205, and select $a_2$ and $a_3$ to calculate an estimated zero crossing moment since they are closest to zero, $a_2$ is greater than zero and $a_3$ is less than zero. The zero crossing estimator 206 may calculate the estimated zero crossing moment through linear interpolation. The estimated zero crossing moment is shown as the solid line. The TIA 207 may calculate the timing jitter by comparing the estimated zero crossing moment with an expected zero crossing moment in the clock signal from the PLL 104 and represented by dash lines. When the over-sampling rate is 4, the expected zero crossing moment is the moment for $a_2$.

It should be understood that the interpolator bank 205 may have a larger or smaller number of interpolators. An interpolator bank with a larger number of interpolators may provide more samples to the zero crossing estimator 206, so that the zero crossing estimator 206 may provide the estimated zero crossing moment with finer resolution, although the circuit may become more complicated.

Figure 6:
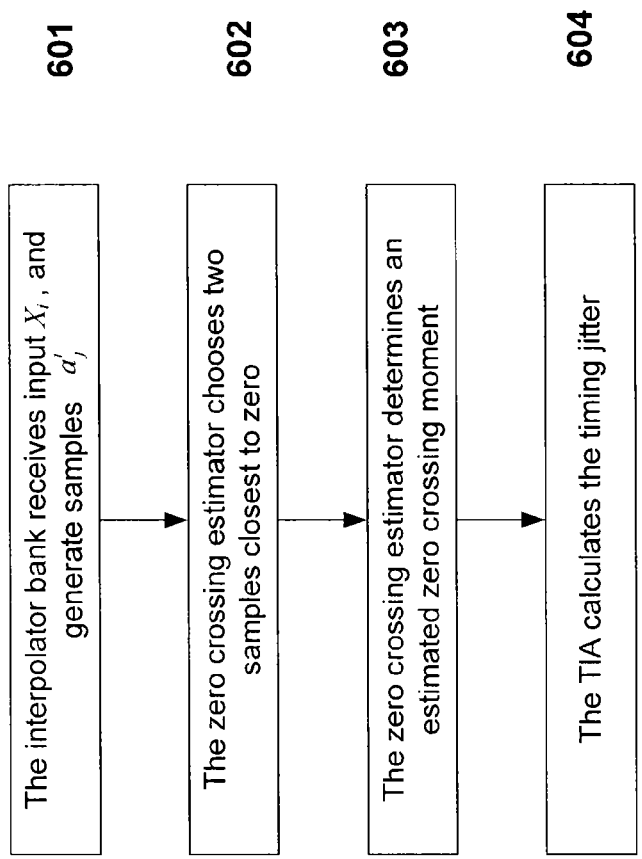
FIG. 6 illustrates a flow chart of the operation of a digital timing jitter measurement circuit according to one embodiment of the present invention.

FIG. 6 illustrates a flow chart of the operation of a digital jitter measurement circuit according to one embodiment of the present invention.

In one embodiment, the output of the limit equalizer 103 may be $X_i$, where i denotes the sample time. At 601, the interpolator bank 205 may receive $X_i$, and generate outputs $a_j^i$, corresponding to samples from time i−1 to time i, where j denotes the interpolator 1, . . . , and m−1.

At 602, the zero crossing estimator 206 may receive $a_j^i$ from the interpolator bank 205 and determine between which two samples the zero crossing occurs. At 603, the zero crossing estimator 206 may estimate a zero crossing moment through linear interpolation. If a zero crossing occurs between $a_j$ and $a_{j+1}$, then, if Δ denotes the time difference between the estimated zero crossing time and the time j, then Δ may be calculated as:

$$\Delta = \frac{a_j}{a_j - a_{j+1}} \frac{1}{m} \quad (1)$$

where m is the over-sampling rate.

Once the estimated zero crossing moment is determined, the jitter $t_i$ may be calculated at 604 as follows:

$$t_i = \Delta + \left(\frac{j}{m} - \frac{1}{2}\right) = \left(\frac{a_j}{a_j - a_{j+1}} + j\right)\frac{1}{m} - \frac{1}{2} \quad (2)$$

In the example shown in FIG. 5, m=4 and the zero crossing occurs between samples $a_2$ and $a_3$. This indicates that the zero crossing occurs between time i+0.5 and time i+0.75. Then Δ may be obtained according to the equation (1) as follows:

$$\Delta = \frac{a_2}{a_2 - a_3} \frac{1}{4}$$

and the jitter may be calculated according to the equation (2) as follows:

$$t_i = \left(\frac{a_2}{a_2 - a_3} + 2\right)\frac{1}{4} - \frac{1}{2} = \frac{0.25 a_2}{a_2 - a_3}$$

In one embodiment, the interpolators in the interpolator bank 205 may use LaGrange interpolation, and the value $a_j^i$ at t may be decided by $X_{i-M}$~$X_{i+N}$ by the equation (3), letting $k_1 = i - M$, $k_2 = i + N$, and k2>k1:

$$a(t) = \sum_{j=k_1}^{k_2} \frac{[t-k_1][t-(k_1+1)] \cdots [t-(k_1+j-1)] [t-(k_1+j+1)] \cdots [t-(k_2-1)][t-k_2]}{[j-k_1][j-(k_1+1)] \cdots [j-(k_1+j-1)] [j-(k_1+j+1)] \cdots [j-(k_2-1)][j-k_2]} X_j \quad (3)$$

In the example depicted in FIG. 5, the FIR length K=4, so that only four samples $X_{i-1}$~$X_{i+2}$ may be used to decide a(t), and the equation (3) may be simplified as follows:

$$a(t) \approx \frac{t(t-1)(t-2)}{-1(-1-1)(-1-2)} X_{i-1} + \frac{(t+1)(t-1)(t-2)}{(0+1)(0-1)(0-2)} X_i + \frac{(t+1)t(t-2)}{(1+1)1(1-2)} X_{i+1} + \frac{(t+1)t(t-1)}{(2+1)2(2-1)} X_{i+2} \quad (4)$$

$$\approx f_3 \cdot X_{i-1} + f_2 \cdot X_i + f_1 \cdot X_{i+1} + f_0 \cdot X_{i+2}$$

In the example shown in FIG. 5, the over-sampling rate m=4, so that a bit interval is divided into four sub-intervals, and t=0, 0.25, 0.5, and 0.75 for $a_0$, $a_1$, $a_2$ and $a_3$ respectively. The values of $a_0$, $a_1$, $a_2$ and $a_3$ are as follows when substituting t in the equation (4):

$$a_0 = X_i$$

$$a_1 = -\frac{7}{128} \cdot X_{i-1} + \frac{105}{128} \cdot X_i + \frac{35}{128} \cdot X_{i+1} - \frac{5}{128} \cdot X_{i+2}. \quad (5)$$

$$a_2 = -\frac{8}{128} \cdot X_{i-1} + \frac{72}{128} \cdot X_i + \frac{72}{128} \cdot X_{i+1} - \frac{8}{128} \cdot X_{i+2}, \quad (6)$$

$$a_3 = -\frac{5}{128} \cdot X_{i-1} + \frac{35}{128} \cdot X_i + \frac{105}{128} \cdot X_{i+1} - \frac{7}{128} \cdot X_{i+2}. \quad (7)$$

In one embodiment, the interpolators in the interpolator bank 205 may use sin c interpolation, and the value $a_j^i$ at t may be decided by $X_{i-M}$~$X_{i+N}$ by equation (8), denoting $$\text{sinc}(t) \approx \frac{\sin(\pi t)}{\pi t}:$$

$$a(t) = \sum_{j=-M}^{N} X_{i+j} \cdot \text{sinc}(t - j) \quad (8)$$

The equation (8) may be simplified as follows when using $X_{i-1} \sim X_{i+2}$ to decide a(t):

$$a(t) \approx X_{i-1} \cdot \sin\ c(t+1) + X_i \cdot \sin\ c(t) + X_{i+1} \cdot \sin\ c(t-1) + X_{i+2} \cdot \sin\ c(t-2) \approx f_3 \cdot X_{i-1} + f_2 \cdot X_i + f_1 \cdot X_{i+1} + f_0 \cdot X_{i+2} \quad (9)$$

In the example shown in FIG. 5, K=4 and m=4, thus a bit interval is divided into four sub-intervals, and t=0, 0.25, 0.5, and 0.75 for $a_0$, $a_1$, $a_2$ and $a_3$ respectively. The values of $a_0$, $a_1$, $a_2$ and $a_3$ are as follows when substituting t in the equation (9):

$$a_0 = X_i$$

$$a_1 = -0.18 \cdot X_{i-1} + 0.90 \cdot X_i + 0.30 \cdot X_{i+1} - 0.13 \cdot X_{i+2}. \quad (10)$$

$$a_2 = -0.21 \cdot X_{i-1} + 0.64 \cdot X_i + 0.64 \cdot X_{i+1} - 0.21 \cdot X_{i+2}, \quad (11)$$

$$a_3 = -0.13 \cdot X_{i-1} + 0.30 \cdot X_i + 0.90 \cdot X_{i+1} - 0.18 \cdot X_{i+2}. \quad (12)$$

Several features and aspects of the present invention have been illustrated and described in detail with reference to particular embodiments by way of example only, and not by way of limitation. Alternative implementations and various modifications to the disclosed embodiments are within the scope and contemplation of the present disclosure. Therefore, it is intended that the invention be considered as limited only by the scope of the appended claims.

What is claimed is:

1. An apparatus for measuring timing jitter, the apparatus comprising:
   a converter configured to convert a signal to a digital signal;
   a phase-locked loop (PLL), coupled to the converter, configured to provide a clock signal according to a frequency of the signal; and
   an interpolator bank, coupled to the converter and including m interpolators configured to over-sample the digital signal, wherein m is an over-sampling rate and m is not smaller than 2, the interpolator bank configured to generate a sample a(t) at time t as:

$$a(t) = \sum_{j=k_1}^{k_2} \frac{[t-k_1][t-(k_1+1)] \cdots [t-(k_1+j-1)] [t-(k_1+j+1)] \cdots [t-(k_2-1)][t-k_2]}{[j-k_1][j-(k_1+1)] \cdots [j-(k_1+j-1)] [j-(k_1+j+1)] \cdots [j-(k_2-1)][j-k_2]} X_j$$

where $X_j$ denotes a sample received from an equalizer by j-th interpolator, $k_1=i-M$, $k_2=i+N$, $k_2>k_1$ at time i, and M and N are integers.

2. The apparatus of claim 1, further comprising:
   a zero crossing estimator configured to receive samples from the interpolator bank and select two samples closest to zero.

3. The apparatus of claim 2, wherein the zero crossing estimator uses the two samples closest to zero to calculate an estimated zero crossing moment.

4. The apparatus of claim 3, wherein Δ denotes a time difference between the estimated zero crossing moment and a time j, then Δ is calculated as:

$$\Delta = \frac{a_j}{a_j - a_{j+1}} \frac{1}{m}$$

where $a_j$ corresponds to a sample generated at time j.

5. The apparatus of claim 4, wherein $t_i$ denotes a timing jitter at time i, $t_i$ is calculated as:

$$t_i = \Delta + \left(\frac{j}{m} - \frac{1}{2}\right) = \left(\frac{a_j}{a_j - a_{j+1}} + j\right)\frac{1}{m} - \frac{1}{2}.$$

6. The apparatus of claim 3, wherein the zero crossing estimator calculates the estimated zero crossing moment by using linear interpolation.

7. The apparatus of claim 2, further comprising:
   an analyzer, coupled to the converter and the PLL, configured to calculate a timing jitter by comparing an estimated zero crossing moment from the zero crossing estimator and an expected zero crossing moment in the clock signal from the PLL.

8. The apparatus of claim 1, wherein the interpolator is a finite impulse response (FIR) interpolator.

9. The apparatus of claim 1, further comprising:
   a limit equalizer, coupled between the converter and the interpolator bank, configured to provide an input to the interpolator bank.

10. The apparatus of claim 1, wherein m=4.

11. A method for measuring timing jitter, the method comprising:
    converting a received signal into a digital signal;
    providing a clock signal according to a frequency of the signal;
    over-sampling the digital signal by an interpolator bank including m interpolators to generate m−1 interpolations of the digital signal, wherein m is an over-sampling rate and m is not less than 2; and
    generating a sample a(t) at time t as:

$$a(t) = \sum_{j=k_1}^{k_2} \frac{[t-k_1][t-(k_1+1)] \cdots [t-(k_1+j-1)] [t-(k_1+j+1)] \cdots [t-(k_2-1)][t-k_2]}{[j-k_1][j-(k_1+1)] \cdots [j-(k_1+j-1)] [j-(k_1+j+1)] \cdots [j-(k_2-1)][j-k_2]} X_j$$

where $X_j$ denotes a sample received from an equalizer by j-th interpolator, $k_1=i-M$, $k_2=i+N$, $k_2>k_1$ at time i, and M and N are integers.

12. The method of claim 11, further comprising:
    receiving samples from the interpolator bank by a zero crossing estimator; and
    selecting two samples closest to zero.

13. The method of claim 12, further comprising:
    using the two samples closest to zero to calculate an estimated zero crossing moment.

14. The method of claim 13, further comprising:
    calculating Δ, a time difference between the estimated zero crossing moment and a time j, as:

$$\Delta = \frac{a_j}{a_j - a_{j+1}} \frac{1}{m}$$

where $a_j$ corresponds to a sample generated at time j.

15. The method of claim 14, further comprising:
calculating $t_i$, a timing jitter at time i, as:

$$t_i = \Delta + \left(\frac{j}{m} - \frac{1}{2}\right) = \left(\frac{a_j}{a_j - a_{j+1}} + j\right)\frac{1}{m} - \frac{1}{2}.$$

16. The method of claim 13, further comprising:
calculating the estimated zero crossing moment by using linear interpolation.

17. The method of claim 12, further comprising:
comparing an estimated zero crossing moment from the zero crossing estimator and an expected zero crossing moment in the clock signal from a phase-locked loop (PLL) to calculate a timing jitter, wherein the PLL is used to provide the clock signal according to the frequency of the signal.

18. The method of claim 11, wherein the interpolator is a finite impulse response (FIR) interpolator.

19. The method of claim 11, further comprising:
provide input signal to the interpolator bank by a limit equalizer, coupled between the converter and the interpolator bank.

20. The method of claim 11, wherein m=4.

* * * * *